(12) United States Patent
Muthiah

(10) Patent No.: US 11,082,168 B1
(45) Date of Patent: Aug. 3, 2021

(54) ENTROPY DRIVEN ENDURANCE FOR NORMALIZED QUALITY OF SERVICE

(71) Applicant: WESTERN DIGITAL TECHNOLOGIES, INC., San Jose, CA (US)

(72) Inventor: Ramanathan Muthiah, Karnataka (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 16/823,714

(22) Filed: Mar. 19, 2020

(51) Int. Cl.
*H04L 1/00* (2006.01)
*H04L 1/20* (2006.01)
*H04L 1/18* (2006.01)
*H04L 1/16* (2006.01)

(52) U.S. Cl.
CPC ............ *H04L 1/203* (2013.01); *H04L 1/0014* (2013.01); *H04L 1/0026* (2013.01); *H04L 1/0041* (2013.01); *H04L 1/1678* (2013.01); *H04L 1/1838* (2013.01)

(58) Field of Classification Search
None
See application file for complete search history.

(56) References Cited

U.S. PATENT DOCUMENTS

| | | | |
|---|---|---|---|
| 4,839,743 A | 6/1989 | Best et al. | |
| 6,016,365 A | 1/2000 | Shin et al. | |
| 8,036,263 B2 | 10/2011 | Wang et al. | |
| 9,037,921 B1 | 5/2015 | Brooker et al. | |
| 9,552,384 B2 | 1/2017 | Narasimha et al. | |
| 10,452,616 B1 * | 10/2019 | Bassov | G06F 3/067 |
| 2014/0089561 A1 | 3/2014 | Pangal et al. | |
| 2016/0191918 A1 * | 6/2016 | Lai | H04N 19/132 375/240.02 |

(Continued)

FOREIGN PATENT DOCUMENTS

| | | |
|---|---|---|
| EP | 3243328 B1 | 7/2019 |
| JP | 2006254366 A | 9/2006 |

(Continued)

OTHER PUBLICATIONS

Luo et al., "Key Frame Extraction of Surveillance Video based on Moving Object Detection and Image Similarity", Pattern Recognition and Image Analysis, 2018, vol. 28, No. 2, pp. 225-231.

*Primary Examiner* — Mujtaba M Chaudry
(74) *Attorney, Agent, or Firm* — Arent Fox LLP

(57) ABSTRACT

Aspects of a storage device including a memory and a controller are provided which allow for data associated with a media stream and having high entropy to be stored in healthier memory locations, with improved data protection, and with more optimal NAND parameters than for data having low entropy. After receiving data associated with a media stream, the controller identifies an entropy level of the data. When the entropy level meets an entropy threshold, the controller stores the data in a first block of the memory associated with a lower BER, and/or with a higher write latency or a first, more discrete voltage. Alternatively, when the entropy level does not meet the entropy threshold, the controller stores the data in a second block of the memory associated with a higher BER, and/or with a lower write latency or a second, less discrete voltage.

19 Claims, 6 Drawing Sheets

(56) References Cited

U.S. PATENT DOCUMENTS

| | | | |
|---|---|---|---|
| 2019/0146786 A1* | 5/2019 | Rahman | G06F 8/4434 717/120 |
| 2020/0134047 A1* | 4/2020 | Bassov | G06F 16/1744 |
| 2020/0341667 A1* | 10/2020 | Bassov | G06F 3/0641 |

FOREIGN PATENT DOCUMENTS

| | | |
|---|---|---|
| KR | 20140051345 A | 4/2014 |
| KR | 20180008966 A | 1/2018 |

\* cited by examiner

ENTROPY DRIVEN ENDURANCE FOR NORMALIZED QUALITY OF SERVICE

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

A surveillance system may store data (e.g. Moving Picture Experts Group (MPEG) transport streams) in the flash storage device. Such transport streams may be constant bit rate (CBR) or variable bit rate (VBR). While VBR allows surveillance systems to dynamically change output bit rates depending on the amount of activity being observed, low cost and high volume surveillance systems with multiple cameras typically create and store content using CBR due to its easier bandwidth management and lower encoding cost and latency. However, as the output bit rate in CBR systems may remain the same even with low activity or information (e.g. a still scene), data may fill up the space of the flash storage device indiscriminately without regard to the usefulness or importance of such data. Such inefficiency in storage may negatively impact the endurance of the flash storage device, as less important data may fill up empty blocks without regard for storage of more important (e.g. high activity) data.

SUMMARY

One aspect of a storage device is disclosed herein. The storage device includes a memory and a controller. The controller is configured to receive from a host device data associated with a media stream. The controller is further configured to identify an entropy level of the data, to store the data in a first block of the memory when the entropy level meets an entropy threshold, and to store the data in a second block of the memory when the entropy level does not meet the entropy threshold. The second block is associated with a higher bit-error-rate (BER) than the first block.

Another aspect of a storage device is disclosed herein. The storage device includes a memory and a controller. The controller is configured to receive from a host device data associated with a media stream and to identify an entropy level of the data. The controller is further configured to store the data in a first block of the memory with at least one of a higher write latency or a first voltage when the entropy level meets an entropy threshold, and to store the data in a second block of the memory with at least one of a lower write latency or a second voltage when the entropy level does not meet the entropy threshold.

A further aspect of a storage device is disclosed herein. The storage device includes a memory and a controller. The controller is configured to receive from a host device data associated with a media stream and to identify an entropy level of the data. The controller is further configured to store the data in a first block of the memory with at least one of a higher write latency or a first voltage when the entropy level meets an entropy threshold, and to store the data in a second block of the memory with at least one of a lower write latency or a second voltage when the entropy level does not meet the entropy threshold. The second block is associated with a higher BER than the first block.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
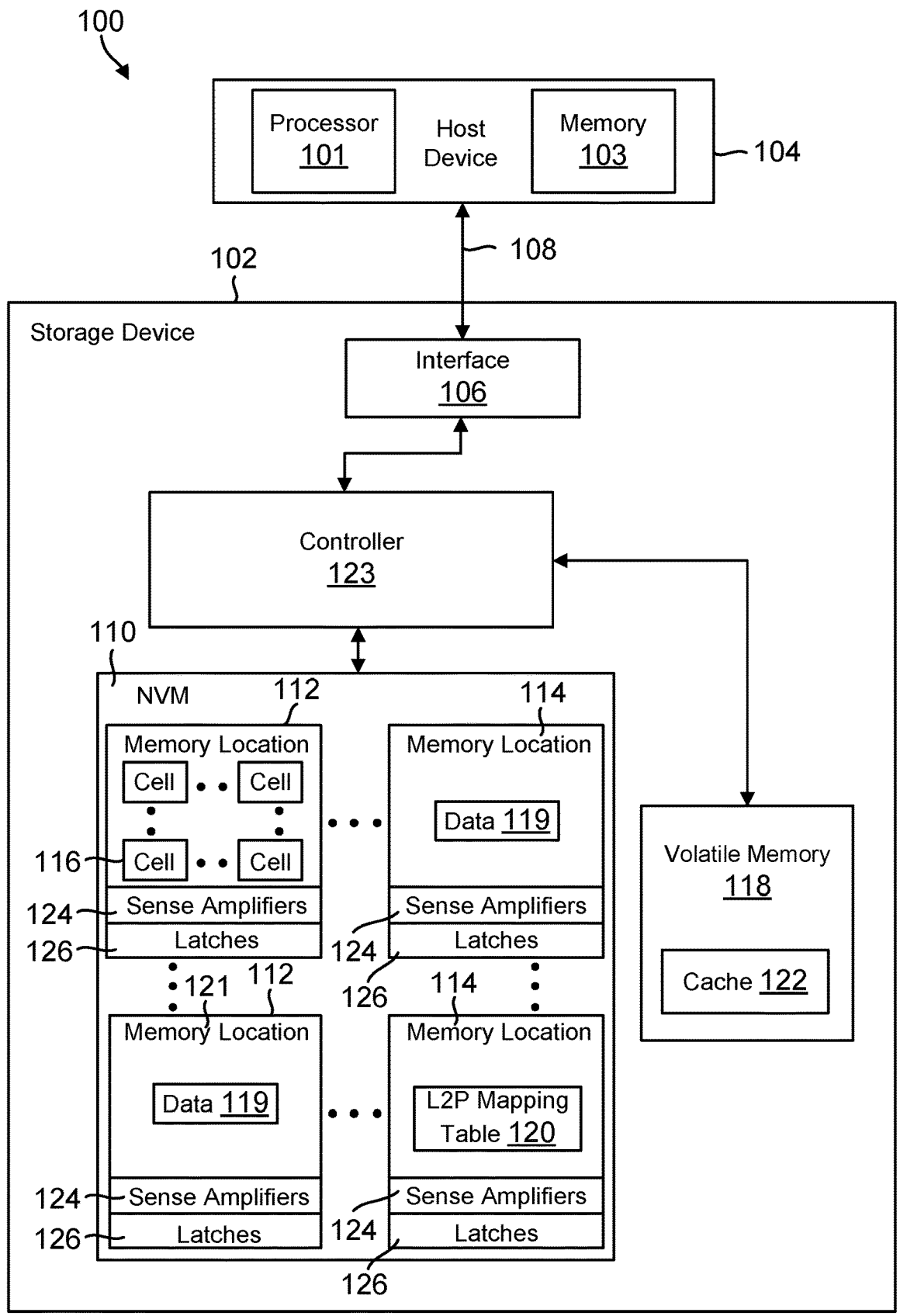
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Surveillance systems may operate using CBR or VBR when capturing and streaming data into a storage device. In CBR, the data captured by a camera of the surveillance system is encoded and streamed as a constant bit rate, regardless of the activity or information being observed. In contrast, in VBR, the surveillance system may dynamically change the output bit rate based on an amount of information being captured; for instance, the bit rate may increase when more activity is being observed (e.g. a stunt scene), and the bit rate may decrease when less activity is being observed (e.g. a still scene). While VBR may thus allow encoded and streamed data rates to adapt to different amounts of activity, CBR may still be advantageous over VBR for low cost surveillance applications due to reduced encoder complexity.

Storage devices may write media data received from a surveillance system to various blocks and read the media data from those blocks during playback. However, as data streamed using CBR into a storage device may occupy identical quantities of storage space, regardless of the amount of information represented by the data, such data may inefficiently fill up the space of the storage device without regard to the importance of the data being stored. For instance, data representing a still scene with no movement may quickly occupy numerous blocks of the storage device, requiring frequent program/erase (P/E) cycles for storing new data. As a result, such blocks may age quickly due to numerous P/E cycles, increasing the BER of these blocks and negatively impacting the endurance of the storage device. Moreover, if subsequent data representing movement is written to these aged, higher BER blocks, such data may have a higher risk of errors or data loss during read playback. For instance, gaps, jerks, or other discontinuities may be perceivable during media playback.

Therefore, in order to improve the performance of the storage device, the present disclosure allows a controller of the storage device to identify an entropy level of data in a media stream prior to NAND programming. For example, the media stream may include a MPEG Transport Stream (MPEG-TS). As used herein, an entropy level indicates an amount of information (e.g. an information density) represented by data in a media stream. For instance, a video frame having a high entropy level includes more information in a given number of bits than a video frame having a low entropy level. As an example, a stunt scene which has substantial activity across frames (e.g. movement) may include video frames of a high entropy level, while a still scene which has low activity across frames (e.g. no movement) may include video frames of a low entropy level.

The controller may determine whether data has a high or low entropy level by comparing it against an entropy threshold, and the controller may bias or route the data in storage differently depending on the entropy level. For instance, the controller may route data with high entropy levels to healthier blocks having a lower BER, and the controller may route data with low entropy levels to unhealthier blocks having a higher BER. Healthier blocks may include, for instance, newer blocks, blocks with less P/E cycles, blocks programmed with longer programming times, sufficient voltage, etc., while unhealthier blocks may include, for instance, aged blocks, blocks with more P/E cycles, blocks programmed with shorter programming times, insufficient voltage, blocks with manufacturing defects, etc. The controller may also provide greater data recoverability, and/or execute write or erase commands with improved NAND parameters such as longer write latencies and more discrete voltages, for higher entropy data than for lower entropy data. As a result, the storage device may allow higher entropy data to have less BER, greater protection and improved NAND parameters compared to lower entropy data, the latter of which if lost would have less impact on storage device performance. For instance, loss of lower entropy data may have less perceivable effect on media playback due to its lower amount of information.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
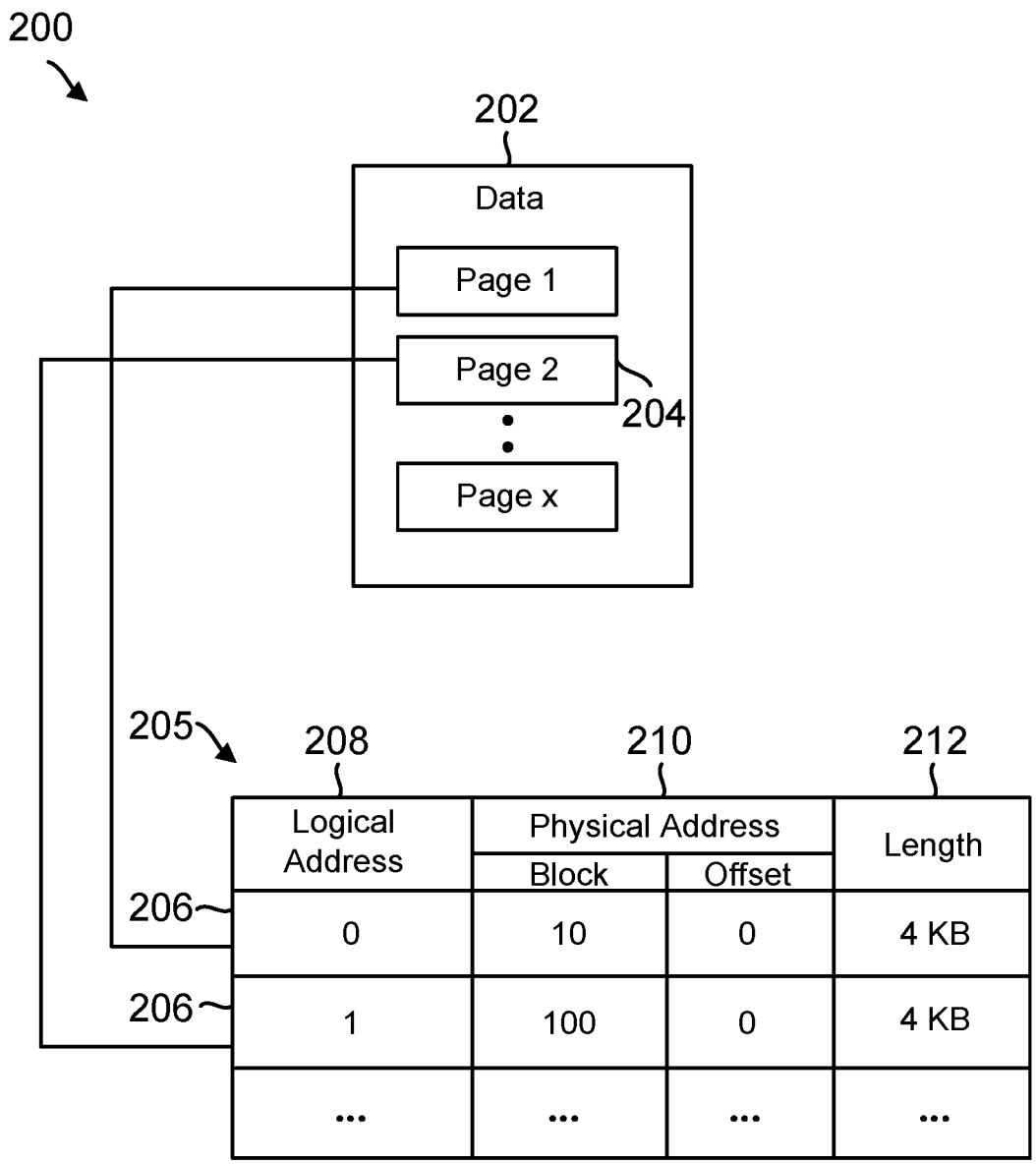
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

The host device 104 may be connected to or include a surveillance system including one or more cameras. In such case, the host device may capture data 119 including media (e.g. video and/or audio) using the one or more cameras and transmit the data to the storage device 102 to be stored in the NVM 110. The controller 123 may then store the data 119 in one or more of the memory locations 112 of the NVM 110. Subsequently, when the controller 123 receives a read command for the data, the controller may sense the data 119 (e.g. using sense amplifiers 124) from the memory location(s) 112 and transmit the data including the media back to the host device 104 for video/audio playback.

However, such storage of the data 119 in the storage device 102 may be inefficient when the data is streamed using CBR. For instance, in CBR, data 119 may be transmitted to the storage device 102 from the host device 104 at a constant rate (e.g. 1 Mbps). Yet, the data 119 may not include the same amount of information or entropy for each given number of bits over time. For example, assuming a given number of bits over time such as 1 Mbps, if the surveillance system captures information of a still scene with no movement, only a portion of those bits may represent actual data while the rest of the bits may be padded to arrive at the constant bit rate. Thus, such data in this example may have little information or low entropy. In contrast, in another example, if the surveillance system captures information of a stunt scene with significant movement, most if not all of the bits may represent actual data with less padding. Thus, such data in this example may have much information or high entropy. As a result, if data 119 is stored in various memory locations 112 of the storage device 102 without regard to whether the data is high entropy or low entropy, the performance of the storage device 102 may be affected. For example, if higher entropy data is stored in blocks with a higher BER than lower entropy data, perceivable distortions in media playback may result due to errors in reading the data 119.

Accordingly, the present disclosure improves the performance of the storage device 102 by allowing the controller 123 to identify an entropy level (or entropy) of the data 119 when the data is received from the host device 104. The controller 123 may identify the entropy level of the data 119, e.g. one or more video frame(s), by comparing an amount of information in that video frame(s) with an amount of information in one or more previous video frame(s). If the controller 123 determines that the entropy level of the data 119 meets a predetermined entropy threshold (e.g. by identifying that a difference in the amount of information between the current frame(s) and the previous frame(s) exceeds a threshold), the controller may identify that data 119 to have a high entropy level; otherwise, the controller may identify the data to have a low entropy level. For instance, the controller 123 may determine a video frame to have a high entropy level if it shows movement with respect to a previous video frame, or the controller 123 may determine a video frame to have a low entropy level if it shows no movement with respect to a previous video frame. The controller 123 may then store the data 119 in different memory locations 112 (e.g. blocks) and/or with different protection levels or write parameters in NAND depending on the entropy level of the data. For instance, the controller 123 may store data 119 with high entropy levels into blocks with less BER in contrast to data 119 with low entropy levels. As a result, less likelihood of high entropy data loss, and correspondingly less errors in media playback, may be observed.

Figure 3:
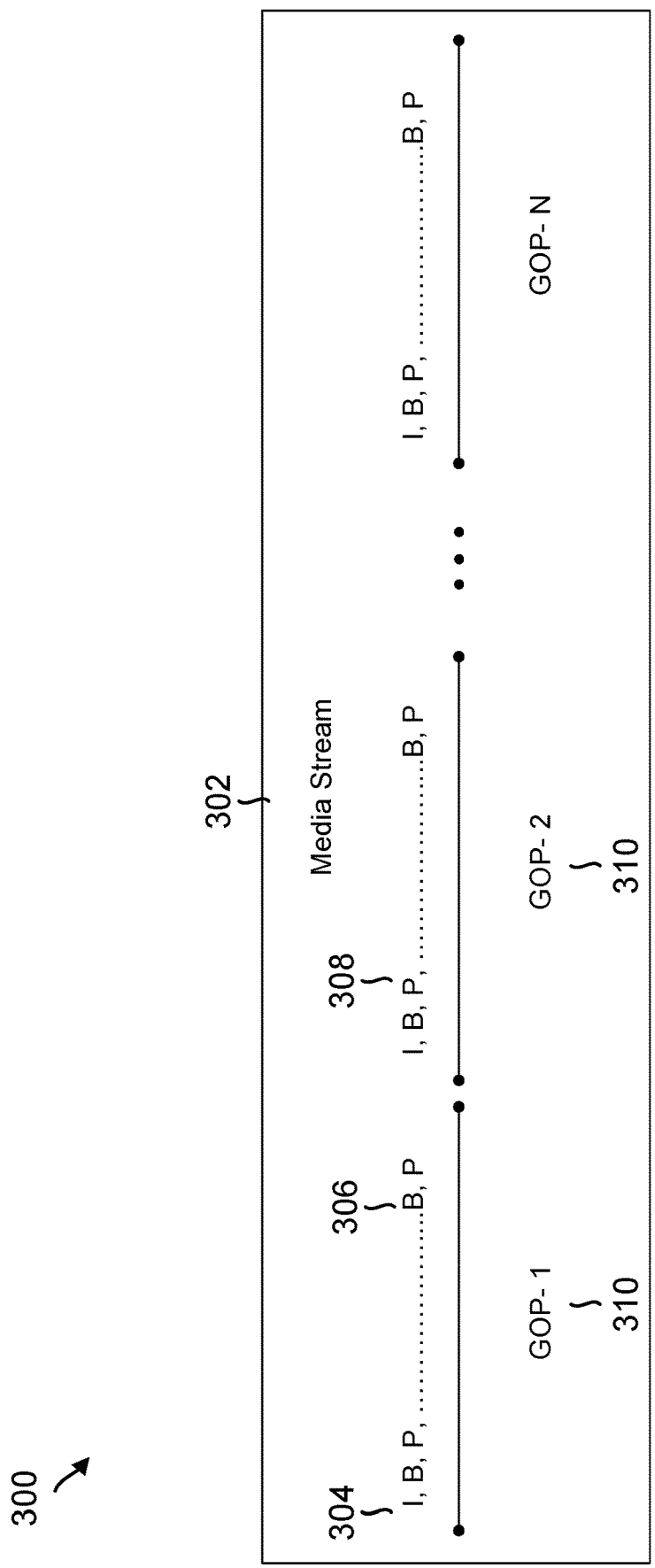
FIG. 3 is a conceptual diagram illustrating an example of video frame types in a media stream received from a host device.

FIG. 3 illustrates an example diagram 300 of a media stream 302 (e.g. MPEG-TS data such as data 119) including video frames received from a surveillance system connected to a host device. The video frames may include frames of different video frame types, including intra-frames (I-frames 304), bidirectional frames (B-frames 306), and predicted frames (P-frames 308). I-frames 304 may include video frames that do not depend on other video frames for rendering and independently present a fixed image. B-frames 306 may include video frames that depend on a previous and a subsequent video frame for reconstruction. P-frames 308 may include video frames that contain information on differences from previous frames. An I-frame and a series of B-frames and P-frames may be arranged in group of pictures (GOP 310), and there may be multiple GOPs 310 each including their own I-frame and B/P-frames in the media stream 302. For instance, each GOP 310 may include 30 frames or another number.

The entropy level of a video frame may be independent of video frame type. For example, in cases such as stunt scenes with significant activity or movement across frames, each I-frame 304 may include a high entropy level. Similarly, B-frames 306 and P-frames 308 may include high entropy levels in such cases due to the significant data changes between frames. However, in other cases such as still scenes with no activity or movement across frames, the first I-frame 304 in a series of GOPs 310 may include a high entropy level (e.g. since its data represents the first image), while subsequent I-frames 304 in the GOPs 310 may include a low entropy level due to insignificant data changes between frames. B-frames 306 and P-frames 308 may also have low entropy levels for similar reasons. Therefore, when the controller 123 identifies the entropy level of a video frame, the controller may perform the identification regardless of a video frame type (e.g. I-frame, B-frame, P-frame). In this way, frames including I-frames may be correctly identified as high entropy when they include significant information, or as low entropy when they do not include much information, and the controller 123 may store the frames in different memory locations 112 accordingly based on entropy level rather than frame type.

While the above examples refer to entropy level identification and storage of video, the present disclosure may also be applied to audio or other forms of media in a media stream. For instance, data 119 received from the host device 104 for storage in storage device 102 may include audio by itself (e.g. a music file), or audio accompanying video (e.g. a movie). In one example, the audio may be received as audio frames which respectively accompany each video frame, and the controller 123 may determine that information in each audio frame changes significantly between frames (e.g. a scene with music or communication). In such case, the controller 123 may determine the audio frames to have a high entropy level. In another example, the audio may be muted throughout an entire scene or parts of a scene, and the controller 123 may determine that information in various audio frames may not change significantly between frames (e.g. a silent scene or with audio gaps or pauses). In such case, the controller 123 may determine the audio frames to have a low entropy level. Accordingly, the controller 123 may store audio frames in different memory locations 112 accordingly based on entropy level. Moreover, the controller may identify entropy levels independently for audio and video. For instance, in the case of a stunt scene with muted audio, the controller may identify the video frames as high entropy and the audio frames accompanying the video frames as low entropy, and the controller may store the video frames and audio frames separately in the NVM 110 based on their respective entropy levels.

As a result, the controller 123 may identify an entropy level of data within a dynamically changing media stream and store the data accordingly in the NVM 110. This approach may be advantageous over other approaches such as, for example, identifying a single entropy level of an entire media stream and storing the entire media stream accordingly in the same memory location(s) 112 based on the identified entropy level, since such other approach may not address the entropy level of a media stream possibly changing over time. The present disclosure thus provides improved performance of the storage device 102 by allowing the controller 123 to dynamically process and store data within media streams in the storage device based on changes in entropy level over time.

Figure 4:
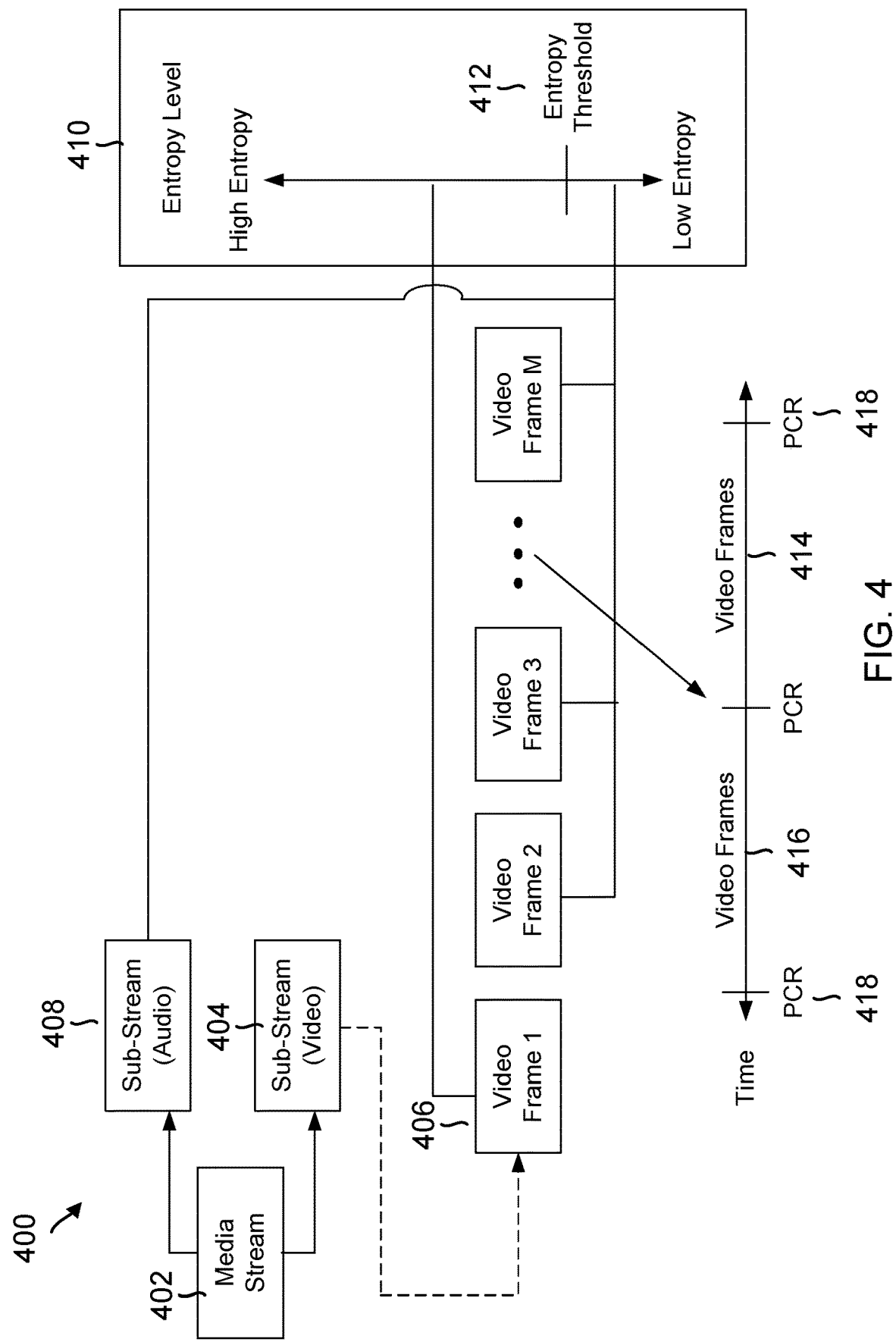
FIG. 4 is a conceptual diagram illustrating an example of a media stream from which entropy levels may be identified by the storage device of FIG. 1.

FIG. 4 illustrates an example diagram 400 illustrating a media stream 402 received from a host device 104 including a video sub-stream 404 containing video frames 406 (e.g. data 119) from which the controller 123 may identify respective entropy levels. Media stream 402 may correspond to media stream 302 of FIG. 3, and video frames 406 may individually correspond to I-frames 304, B-frames 306, or P-frames 308 of FIG. 3, for example. Media stream 402 may also include an audio sub-stream 408 including audio accompanying each video frame 406. Although FIG. 4 illustrates a single media stream with a single audio and video sub-stream received from a single camera of the host device, multiple media streams with respective audio and video sub-streams may be received from multiple cameras of the host device. Thus, MPEG-TS data may be segregated into multiple programs or media streams, each including a separate packet identifier (PID), and each media stream may include its own respective audio and video sub-stream with respective identifiers. The controller may evaluate each media stream or sub-stream individually to determine respective amounts of information or entropy levels for data in each stream, and the controller may store the data of each individual stream or sub-stream in the storage device based on entropy levels accordingly.

The controller may identify an entropy level 410 of data in each video frame 406 (or audio frame or other media) based on an entropy threshold 412. The entropy level 410 may be identified according to various examples. In one example, the controller may compare data associated with each pixel of a current video frame with data associated with each pixel of one or more prior video frames in the time domain on a pixel-by-pixel basis, and determine whether the number of pixels that change exceed an entropy threshold. For instance, entropy threshold 412 may be a preconfigured number of pixels. In another example, the controller may convert the data associated with each video frame into the frequency domain, identify and compare an average or direct current (DC) value associated with a current video frame with a DC value associated with one or more prior video frames, and determine whether the difference in DC values exceeds an entropy threshold. For instance, entropy threshold 412 may be a preconfigured DC value. Alternatively, the controller may identify an amount of information in a current video frame compared to prior video frames according to other examples, e.g. based on a determined value other than a number of pixels or difference in DC content.

Once the controller identifies the entropy level, the controller checks if the entropy level meets the entropy threshold 412. For instance, the controller may determine whether the determined value (e.g. number of pixels, difference in DC value, etc.) meets a preconfigured value indicating a threshold amount of information (e.g. 100 pixels have changed, etc.). If the determined value meets the entropy threshold, the controller 123 identifies the current video frame as having a high entropy level, while if the determined value fails to meet the entropy threshold, the controller identifies the current video frame as having a low entropy level. The controller may similarly identify entropy levels 410 for each video frame 406 (and audio) in the media stream(s) 402. Thus, in the example of FIG. 4, video frame 1 may be identified as having a high entropy level, while video frames 2 and 3 may be identified as having low entropy levels. For instance, in the example of a still scene with no movement, video frame 1 may be a first I-frame in a GOP, while video frames 2 and 3 may be subsequent I-frames (or B/P-frames) in a GOP.

In the above examples, each video frame is individually compared against one or more prior video frames to identify an entropy level. For instance, video frame M may be compared with ten or fifteen previous video frames to identify the low entropy level illustrated in FIG. 4 for video frame M. However, in other examples, multiple video frames within a current time period 414 are compared against multiple video frames in one or more prior time periods 416 to identify an entropy level. The time periods may be delineated by program clock references (PCR) 418, where each pair of PCRs 418 may separate the media stream 402 into fixed time slots (e.g. 100 ms) corresponding to a timing of an accompanying clock signal. The controller 123 may identify whether a group of video frames (e.g. multiple GOPs 310) fit within each time period 414, 416 between a pair or range of PCRs based on a presentation time stamp (PTS) accompanying the video or audio being evaluated. The controller 123 may then identify the entropy level 410 of the video frames in each current time period 414 according to the examples described above. For instance, the controller may determine a DC value indicating an average of all video frames in the current time period 414 and another DC value indicating an average of all video frames in the previous time period(s) 416, and the controller may determine that the video frames in the current time period 414 are high entropy if the difference in the two DC values exceeds the entropy threshold 412 (or low entropy otherwise).

Figure 5:
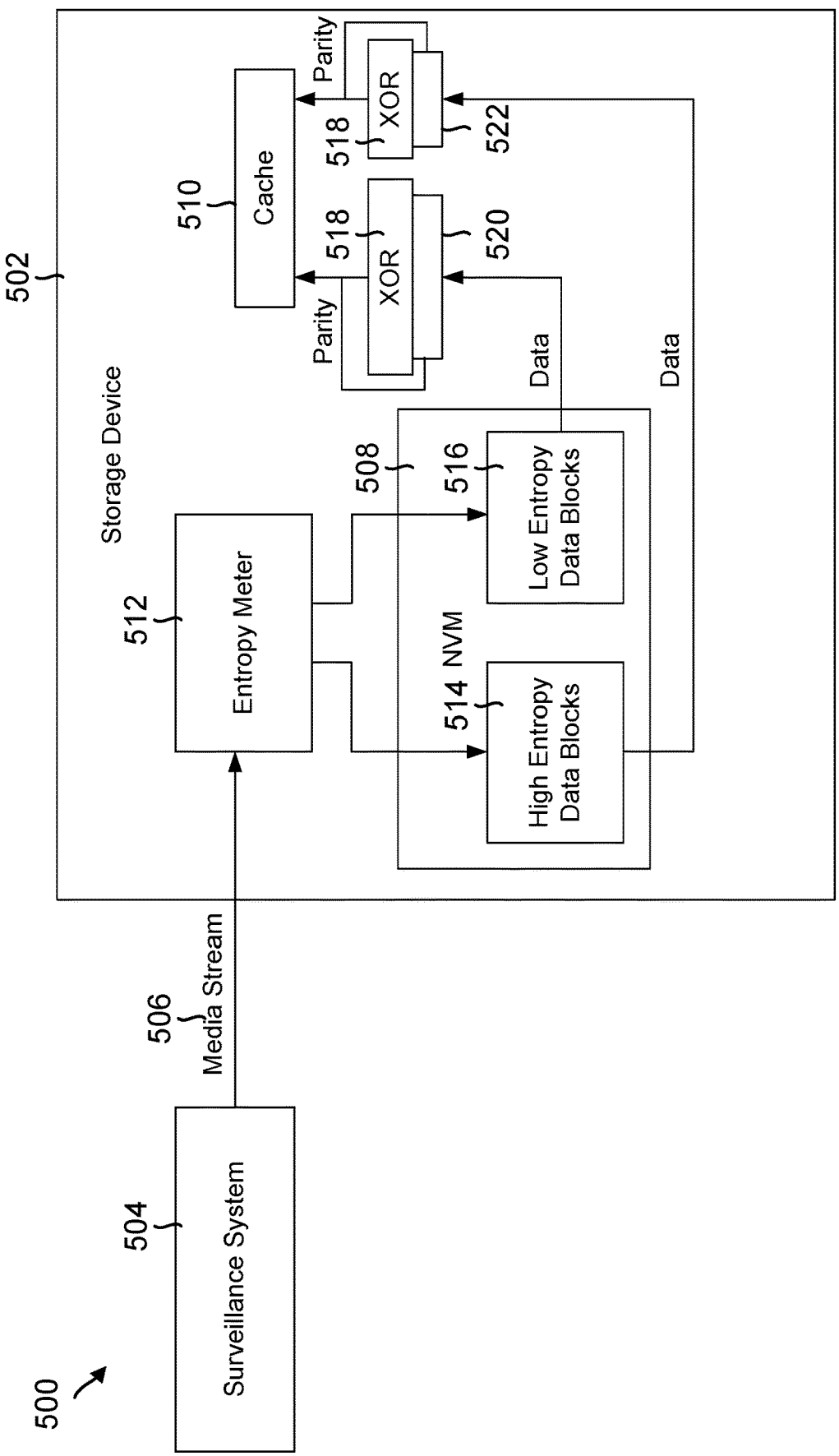
FIG. 5 is a block diagram illustrating an example of data in a media stream stored based on entropy levels into different blocks of the storage device of FIG. 1.

FIG. 5 illustrates an example diagram 500 depicting a storage device 502 that receives data (e.g. data 119 of FIG. 1) from a surveillance system 504 in a media stream 506 and that stores the data in a NVM 508 based on identified entropy levels. Storage device 502 may correspond to storage device 102, surveillance system may be connected to, or included in, host device 104, and NVM 508 may correspond to NVM 110 in FIG. 1. Storage device 502 also includes a cache 510, which may correspond to cache 122 in FIG. 1. Storage device 502 further includes an entropy meter 512 which is a module of the controller (e.g. controller 123 of FIG. 1) and that is configured to identify entropy levels (e.g. entropy level 410) of the data (e.g. one or more video frames 406) as described according to the examples above.

Storage device 502 may include one or more blocks for storing high entropy data (e.g. high entropy data blocks 514), and one or more blocks for storing low entropy data (e.g. low entropy data blocks 516). High entropy data blocks 514 and low entropy data blocks 516 may correspond to one or more memory locations 112 in the NVM 110 of FIG. 1. High entropy data blocks 514 may be healthier (e.g. have a lower BER) than low entropy data blocks 516. For example, high entropy data blocks 514 may be newer/less aged, may be subject to less P/E cycles or lighter use, may not include manufacturing defects, or otherwise may be more reliable or less prone to errors than low entropy data blocks 516. The controller 123 may store data in the media stream 506 in either the high entropy data blocks or low entropy data blocks depending on the entropy level identified by entropy meter 512. That is, if the controller identifies data as having a high entropy level, the controller may store that data in one or more of the high entropy data blocks 514, and if the controller identifies the data as having a low entropy level, the controller may store that data in one or more of the low entropy data blocks 516. As a result, high entropy data may be better protected from errors or data loss than low entropy data in the storage device 502.

Moreover, storage device 102, 502 may include exclusive-or (XOR) gates 518 that may be used to provide error correction codes (ECC) such as parity data for use in data recovery. When data is written to memory locations 112, the data is input into the XOR gates 518 to form a bin representing the parity data, and this bin is stored in cache 510. For instance, if 32 KB of data is written to a block, a bin of 4 KB (parity data) may be generated and stored in cache. Subsequently, when the data is read from the memory location, error detection may be performed by XOR'ing the data (e.g. multiple word line lengths) using XOR gates 518 with the bin/parity data from the cache 510. If the result of the XOR operation is not 0, an error in the data may be detected. If the error is correctable, the other data may again be XOR'ed together with the parity data to recover the original data for that memory location.

The protection level of the XOR gates 518 may be based on XOR stripe length and bin/parity data size. The number of word lengths that are XOR'ed together with the parity data to detect an error may be referred to as an XOR stripe length. For instance, assuming an example word line length of 4 KB and a bin/parity data size of 4 KB, an XOR stripe length of 2 may indicate that two word lines (8 KB) of data are XOR'ed together with the parity data when performing error detection/correction, while an XOR stripe length of 8 may indicate that eight word lines (32 KB) are XOR'ed together with the parity data when performing error detection/correction. Larger XOR stripe lengths with respect to a given bin/parity data size may result in lower likelihood of error detectability and data recovery, since there would be less parity data to XOR with the other data during data recovery. Thus, in the example above, an XOR stripe length of 8 for a given parity data size would have a weaker protection level than an XOR stripe length of 2 for the same parity data size.

Similarly, larger bin/parity data sizes with respect to a given XOR stripe length may result in greater likelihood of error detectability and data recovery, since there would be more parity data to XOR with the other data during data recovery. For example, a parity data size of 8 KB for a given XOR stripe length would have a stronger protection level than a parity data size of 4 KB for that same XOR stripe length. However, larger parity data sizes may use up more memory, resulting in reduced endurance of the storage device 502 (e.g. due to more P/E erase cycles over time). Thus, it may be advantageous to balance the interest of having stronger protection levels notwithstanding lower endurance based on the entropy level of the data being protected.

Accordingly, the controller 123 may configure the XOR gates 518 to include a smaller XOR stripe length or a larger parity data size for stronger ECC protection of data from high entropy data blocks 514, and the controller may configure the XOR gates 518 to include a larger XOR stripe length or a smaller parity data size for weaker ECC protection of data from low entropy data blocks 516. For example, the controller may prevent data from high entropy data blocks 514 from being input to the XOR gates 518 to reduce the XOR stripe length, or the controller may allow additional data from low entropy data blocks 516 to be input to the XOR gates 518 to increase the XOR stripe length. Thus, FIG. 5 illustrates XOR gates 518 include an XOR stripe length 520 for low entropy data blocks 516 that is larger than an XOR stripe length 522 for high entropy data blocks 514. As a result, high entropy data may have a higher protection level than low entropy data in the storage device 502, while also increasing memory endurance by reducing the bin/parity data size for lower entropy data.

Additionally, as a result of the reduced memory usage for parity of lower entropy data, the controller may use the memory for other purposes. For instance, rather than storing additional parity data in cache 510 for lower entropy data blocks 516, the controller may use that space in cache 510 for performing garbage collection (GC) or another function.

Furthermore, data may be written to the NVM 508 based on various parameters, including write latency and voltage. Write latency may include an amount of time used to program data in a cell of the NAND, and voltages may range between e.g. 0V and Vcc for a logical 0 or 1, respectively. If data is written to a block with a longer write latency, the data may be successfully readable from the block; however, if data is written to a block with shorter write latency, the data may not be as sufficiently programmed and may be more prone to read errors (e.g. higher BER). Similarly, if data is written to a block with a voltage that is discrete (e.g. close to 0V or Vcc), the data may be successfully written as a logical 0 or a 1 based on the voltage; however, if data is written to the block with a voltage that is less discrete or more ambiguous (e.g. equally between 0 V and Vcc), the data may not be correctly stored and may also be more prone to read errors (e.g. higher BER).

While longer write latencies and proper voltages may result in less read errors, it may be advantageous in certain cases to write data with shorter latencies or less discrete voltages (e.g. to reduce P/E cycles and shorten the aging of blocks, reduce power consumption of the storage device, etc.). Accordingly, the controller 123 balances these interests by tuning different NAND write or trim (e.g. program and erase) parameters for data stored in high entropy data blocks 514 than for data stored in low entropy data blocks 516. For example, if the entropy meter 512 of the controller identifies data as including a high entropy level, the controller may store the data in the high entropy data blocks 514 with a higher write latency or a more discrete voltage, while if the entropy meter 512 of the controller identifies data as including a low entropy level, the controller may store the data in the low entropy data blocks 516 with a lower write latency or a less discrete voltage. Similarly, the controller may execute write or trim commands (e.g. programs and erases) of the high entropy data blocks 514 with higher write latency or more discrete voltages than for low entropy data blocks 516. As a result, high entropy data blocks may have greater endurance (e.g. less BER) than low entropy data blocks.

The above examples of FIGS. 3-5 refer to identification of an entropy level 410 for data of a media stream 302, 402 and storage of the data in healthier, better protected, or greater endurance blocks (e.g. high entropy data blocks 514 versus low entropy data blocks 516) based on a single entropy threshold 412. However, multiple levels of entropy thresholds 412 may be configured to which the above examples may be applied. Thus, data from a media stream may be identified as having different degrees of entropy levels (e.g. low, medium, high, etc.), and the controller may modify the storage, protection, and NAND write parameters based on the varying degrees of entropy levels. For instance, data with a medium entropy level may be stored in a less healthy block (e.g. more BER), may include less protection (e.g. a longer XOR stripe length or shorter bin/parity data size), or may be written with shorter write latency or less discrete voltages than data with a high entropy level. Similarly, data with a medium entropy level may be stored in a more healthy block (e.g. less BER), with more protection (e.g. a shorter XOR stripe length or longer bin/parity data size), or may be written with longer write latency or more discrete voltages than data with a low entropy level. Various entropy levels may be identified and data stored accordingly.

Additionally, while the above examples refer to identification of entropy levels and storage based on data in a media stream received from a surveillance system of a host device in CBR, the present disclosure is not so limited. For example, the controller may similarly identify entropy levels for data received from the surveillance system in VBR, and the controller may similarly store the data in high or low entropy data blocks accordingly. Moreover, the media stream may not necessarily be received from a surveillance system; for example, the media stream may be unrelated to surveillance or may be received within any application from the host device 104.

Figure 6:
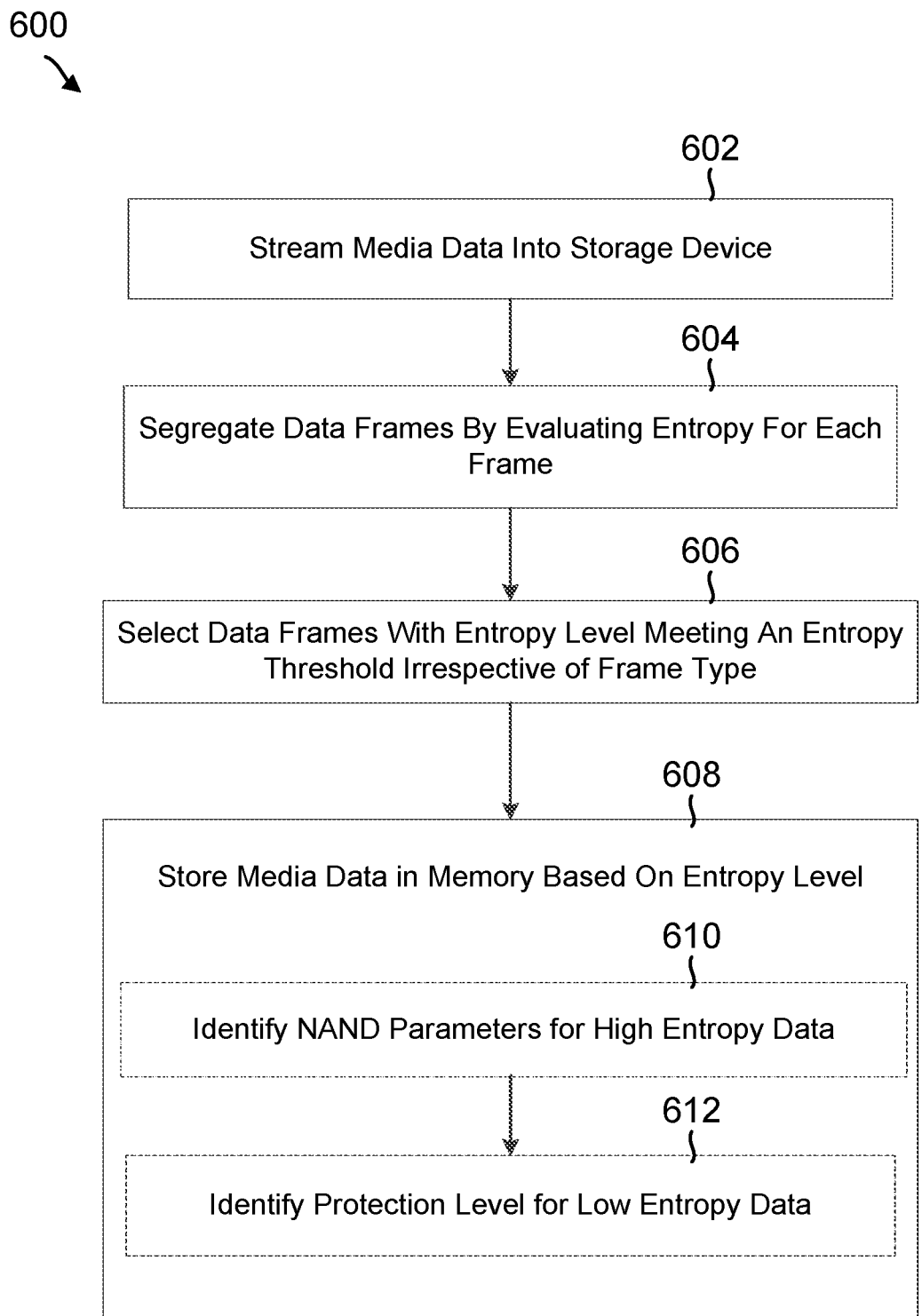
FIG. 6 is a flow chart illustrating a method for storing data based on entropy levels by the storage device of FIG. 1.

FIG. 6 illustrates an example flow chart 600 of a method of storing data based on entropy levels. For example, the method can be carried out in a storage device 102, 502 such as the one illustrated in FIGS. 1 and 5. Each of the steps in the flow chart can be controlled using the controller as described below (e.g. controller 123), or by some other suitable means. Optional aspects are illustrated in dashed lines.

As represented by block 602, the controller receives from a host device data associated with a media stream. The media stream may include a CBR. For example, referring to FIGS. 1 and 3-5, the controller 123 may receive from a host device 104 data (e.g. data 119) associated with a media stream (e.g. media stream 302, 402, 506). The media stream may be streamed from the host device using CBR. For instance, data 119 may be received from the host device 104 at a constant rate (e.g. 1 Mbps).

As represented by block 604, the controller may identify an entropy level of the data received from the host device.

The controller may segregate the data based on its entropy level, for example, as high entropy video frames or low entropy video frames. For example, referring to FIGS. 1 and 4, the controller 123 may identify an entropy level 410 of the data 119 (e.g. video frames 406) received from the host device 104, and the controller may segregate the data as having a high entropy level or a low entropy level as illustrated in FIG. 4. For instance, the controller may identify video frame 1 as including a high entropy level, and video frames 2 and 3 as having a low entropy level.

In one example, the controller may identify the entropy level based on a difference between a direct current (DC) coefficient of a current video frame and a previous DC coefficient of one or more prior video frames. For instance, referring to FIG. 4, the controller may identify an entropy level 410 of data in each video frame 406 (or audio frame or other media) based on an entropy threshold 412 by converting the data associated with each video frame into the frequency domain, identify and compare an average (DC) value associated with a current video frame with a DC value associated with one or more prior video frames, and determine whether the difference in DC values exceeds an entropy threshold. If the determined DC value meets the entropy threshold, the controller 123 identifies the current video frame as having a high entropy level, while if the determined DC value fails to meet the entropy threshold, the controller identifies the current video frame as having a low entropy level.

In another example, the controller may identify the entropy level based on a difference between a DC coefficient of current video frames in a first period of time and a previous DC coefficient of prior video frames in a second period of time, where the first period of time and the second period of time are each between a respective set of PCRs. For instance, referring to FIG. 4, the controller 123 may identify the entropy level 410 of the video frames 406 in a current time period 414 within one set of PCRs 418 based on a comparison with the video frames 406 in one or more prior time periods 416 within another set of PCRs 418. The controller 123 may identify whether a group of video frames (e.g. multiple GOPs 310) fit within each time period 414, 416 based on a video PTS or audio PTS accompanying the video frames or audio respectively. The controller may determine a DC value indicating an average of all video frames in the current time period 414 and another DC value indicating an average of all video frames in the previous time period(s) 416, and the controller may determine whether the difference in the two DC values exceeds the entropy threshold 412. If the difference exceeds the threshold, the controller may determine the video frames in the current time period 414 to be high entropy; otherwise the controller may determine the video frames in the current time period to be low entropy.

As represented by block 606, the controller may select data frames (e.g. video frames, audio frames, or other media) whose entropy level are identified to meet the entropy threshold at 604. For instance, as described above with respect to FIG. 4, the controller may identify various video frames 406 that meet the entropy threshold 412 as having a high entropy level. The entropy level may be identified regardless of a current video frame type of the current video frame. For instance, referring to FIG. 3, the entropy level of a video frame may be independent of video frame type. For example, in cases such as still scenes with no activity or movement across frames, the first I-frame 304 in a series of GOPs 310 may include a high entropy level (e.g. since its data represents the first image), while subsequent I-frames 304 in the GOPs 310 may include a low entropy level due to insignificant data changes between frames. B-frames 306 and P-frames 308 may also have low entropy levels for similar reasons. Therefore, when the controller 123 identifies the entropy level of a video frame, the controller may perform the identification regardless of a video frame type (e.g. I-frame, B-frame, P-frame).

As represented by block 608, the controller may store the data in a first block of the memory when the entropy level meets an entropy threshold, and the controller may store the data in a second block of the memory when the entropy level does not meet the entropy threshold. The second block may be associated with a higher BER than the first block. For example, referring to FIG. 5, if the controller 123 identifies data in the media stream 506 as having a high entropy level (e.g. entropy level 410), the controller may store that data in one or more of the high entropy data blocks 514, and if the controller identifies the data as having a low entropy level, the controller may store that data in one or more of the low entropy data blocks 516.

As represented by block 610, the controller may identify NAND parameters for high entropy data. For example, referring to FIG. 5, data may be written to the NVM 508 based on various parameters, including write latency and voltage. The controller may store the data in the first block with at least one of a higher write latency or a first voltage when the entropy level meets the entropy threshold, and the controller may store the data in the second block with at least one of a lower write latency or a second voltage when the entropy level does not meet the entropy threshold. For instance, again referring to FIG. 5, if the entropy meter 512 of the controller identifies data as including a high entropy level, the controller may store the data in the high entropy data blocks 514 with a higher write latency or a more discrete voltage, while if the entropy meter 512 of the controller identifies data as including a low entropy level, the controller may store the data in the low entropy data blocks 516 with a lower write latency or a less discrete voltage.

Finally, as represented by block 612, the controller may identify a protection level for low entropy data. For instance, referring to FIG. 5, the protection level of the XOR gates 518 may be based on XOR stripe length and bin/parity data size. The controller may reduce an XOR stripe length for the data stored in the first block when the entropy level meets the entropy threshold, and the controller may increase an XOR stripe length for the data stored in the second block when the entropy level does not meet the entropy threshold. For example, referring again to FIG. 5, the controller 123 may configure the XOR gates 518 to include a reduced XOR stripe length or a larger parity data size for stronger ECC protection of data from high entropy data blocks 514, and the controller may configure the XOR gates 518 to include an increased XOR stripe length or a smaller parity data size for weaker ECC protection of data from low entropy data blocks 516. Thus, FIG. 5 illustrates XOR gates 518 include an XOR stripe length 520 for low entropy data blocks 516 that is larger than an XOR stripe length 522 for high entropy data blocks 514.

The media stream may include a first sub-stream including video and a second sub-stream including audio. For example, referring to FIG. 4, the media stream 402 received from the host device may include a video sub-stream 404 and an audio sub-stream 408. The controller may be identify a first entropy level of the data in the first sub-stream that meets the entropy threshold, and the controller may identify a second entropy level of the data in the second sub-stream that does not meet the entropy threshold. For instance, referring to FIG. 3, the controller may identify entropy levels independently for audio and video. For instance, in the case of a stunt scene with muted audio, the controller may identify the video frames as high entropy and the audio frames accompanying the video frames as low entropy, and the controller may store the video frames and audio frames separately in the NVM 110 based on their respective entropy levels. The controller may store the data in the first sub-stream in the first block, and the controller may store the data in the second sub-stream in the second block. For instance, referring to FIG. 5, the controller may store the high entropy video frames in one or more of the high entropy data blocks 514, and the controller may store the low entropy audio frames in one or more of the low entropy data blocks 516.

Accordingly, the present disclosure optimizes storage of data in the storage device by separately storing data in the memory including different amounts of information or entropy. Data with high entropy levels may be stored in healthier or higher endurance blocks having a lower BER, while data with low entropy levels may be stored unhealthier or lower endurance blocks having a higher BER. The controller may also provide greater protection levels (e.g. XOR stripe lengths and parity data sizes) and fine-tuned NAND parameters (e.g. longer write latencies and higher or lower voltages) for higher entropy data than for lower entropy data). As a result, higher entropy data may be better protected and recoverable than lower entropy data, which may be less important if lost due to having less perceivable effect on media playback. Thus, QoS may be normalized for optimal media playback and storage device performance.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory; and
a controller coupled to the memory and configured to:
receive data associated with a media stream from a host device,
determine whether an entropy level of the data exceeds an entropy threshold,
store the data in a first block of the memory that is associated with a first bit-error-rate (BER) when the entropy level exceeds the entropy threshold, and
store the data in a second block of the memory that is associated with a second BER greater than the first BER when the entropy level does not exceed the entropy threshold.

2. The storage device of claim 1, wherein the media stream includes a constant bit rate (CBR).

3. The storage device of claim 1, wherein the controller is further configured to identify the entropy level based on a difference between a direct current (DC) coefficient of a current video frame and a previous DC coefficient of one or more prior video frames.

4. The storage device of claim 3, wherein the entropy level is identified regardless of a current video frame type of the current video frame.

5. The storage device of claim 1, wherein the controller is further configured to identify the entropy level based on a difference between a direct current (DC) coefficient of current video frames in a first period of time and a previous DC coefficient of prior video frames in a second period of time, wherein the first period of time and the second period of time are each between a respective set of program clock references (PCR).

6. The storage device of claim 1, wherein the controller is further configured to store the data in the first block with at least one of a higher write latency or a first voltage when the entropy level exceeds the entropy threshold, and to store the data in the second block with at least one of a lower write latency or a second voltage when the entropy level does not exceed the entropy threshold.

7. The storage device of claim 1, wherein the controller is further configured to reduce an XOR stripe length for the data stored in the first block when the entropy level exceeds the entropy threshold, and to increase an XOR stripe length for the data stored in the second block when the entropy level does not exceed the entropy threshold.

8. The storage device of claim 1, wherein the media stream includes a first sub-stream comprising video and a second sub-stream comprising audio, and
wherein the controller is further configured to:
identify a first entropy level of the data in the first sub-stream that exceeds the entropy threshold,
identify a second entropy level of the data in the second sub-stream that does not exceed the entropy threshold,
store the data in the first sub-stream in the first block, and
store the data in the second sub-stream in the second block.

9. A storage device, comprising:
a memory; and
a controller coupled to the memory and configured to:
receive associated with a media stream from a host device,
determine whether an entropy level of the data exceeds an entropy threshold,
store the data in a first block of the memory with at least one of a first write latency or a first voltage that respectively correspond to a first bit-error-rate (BER) when the entropy level exceeds the entropy threshold, and
store the data in a second block of the memory with at least one of a second write latency or a second voltage that respectively correspond to a second BER greater than the first BER when the entropy level does not exceed the entropy threshold.

10. The storage device of claim 9, wherein the media stream includes a constant bit rate (CBR).

11. The storage device of claim 9, wherein the controller is further configured to identify the entropy level based on a difference between a direct current (DC) coefficient of a current video frame and a previous DC coefficient of one or more prior video frames.

12. The storage device of claim 11, wherein the entropy level is identified regardless of a current video frame type of the current video frame.

13. The storage device of claim 9, wherein the controller is further configured to identify the entropy level based on a difference between a direct current (DC) coefficient of current video frames in a first period of time and a previous DC coefficient of prior video frames in a second period of time, wherein the first period of time and the second period of time are each between a respective set of program clock references (PCR).

14. The storage device of claim 9, wherein the controller is further configured to reduce an XOR stripe length for the data stored in the first block when the entropy level exceeds the entropy threshold, and to increase an XOR stripe length for the data stored in the second block when the entropy level does not exceed the entropy threshold.

15. The storage device of claim 9, wherein the media stream includes a first sub-stream comprising video and a second sub-stream comprising audio, and
wherein the controller is further configured to:
identify a first entropy level of the data in the first sub-stream that exceeds the entropy threshold,
identify a second entropy level of the data in the second sub-stream that does not exceed the entropy threshold,
store the data in the first sub-stream in the first block, and
store the data in the second sub-stream in the second block.

16. A storage device, comprising:
a memory; and
a controller coupled to the memory and configured to:
determine whether an entropy level of data associated with a media stream exceeds an entropy threshold,
store the data in a first block of the memory with at least one of a first write latency or a first voltage that respectively correspond to a first bit-error-rate (BER) when the entropy level exceeds the entropy threshold, and
store the data in a second block of the memory with at least one of a second write latency or a second voltage that respectively correspond to a second BER greater than the first BER when the entropy level does not exceed the entropy threshold.

17. The storage device of claim 16, wherein the controller is further configured to identify the entropy level based on a difference between a direct current (DC) coefficient of a current video frame and a previous DC coefficient of one or more prior video frames.

18. The storage device of claim 16, wherein the controller is further configured to identify the entropy level based on a difference between a direct current (DC) coefficient of current video frames in a first period of time and a previous DC coefficient of prior video frames in a second period of time, wherein the first period of time and the second period of time are each between a respective set of program clock references (PCR).

19. The storage device of claim 16, wherein the controller is further configured to reduce an XOR stripe length for the data stored in the first block when the entropy level exceeds the entropy threshold, and to increase an XOR stripe length for the data stored in the second block when the entropy level does not exceed the entropy threshold.

* * * * *